(12) United States Patent
Yoshitake et al.

(10) Patent No.: US 10,003,067 B2
(45) Date of Patent: Jun. 19, 2018

(54) ELECTRIC STORAGE DEVICE AND METHOD FOR PRODUCING ELECTRIC STORAGE DEVICE

(71) Applicant: GS Yuasa International, Ltd., Kyoto-shi (JP)

(72) Inventors: Shinsuke Yoshitake, Kyoto (JP); Satoshi Murakami, Kyoto (JP); Tomonori Kishimoto, Kyoto (JP)

(73) Assignee: GS YUASA INTERNATIONAL LTD., Kyoto-Shi, Kyoto (JP)

(*) Notice: Subject to any disclaimer, the term of this patent is extended or adjusted under 35 U.S.C. 154(b) by 124 days.

(21) Appl. No.: 14/425,235

(22) PCT Filed: Aug. 27, 2013

(86) PCT No.: PCT/JP2013/072901
§ 371 (c)(1),
(2) Date: Mar. 2, 2015

(87) PCT Pub. No.: WO2014/042005
PCT Pub. Date: Mar. 20, 2014

(65) Prior Publication Data
US 2015/0221926 A1    Aug. 6, 2015

(30) Foreign Application Priority Data
Sep. 12, 2012 (JP) .................. 2012-200309

(51) Int. Cl.
*H01M 2/26* (2006.01)
*H01M 10/04* (2006.01)
(Continued)

(52) U.S. Cl.
CPC .............. *H01M 2/263* (2013.01); *B23K 20/10* (2013.01); *H01M 2/26* (2013.01); *H01M 2/30* (2013.01);
(Continued)

(58) Field of Classification Search
CPC .. B23K 20/10; H01M 2/263; H01M 10/0431; H01M 2/26
See application file for complete search history.

(56) References Cited

U.S. PATENT DOCUMENTS 5,442,251 A * 8/1995 Kaida .................. B06B 1/0603
310/321
5,730,832 A * 3/1998 Sato ....................... B23K 20/10
156/499

(Continued)

FOREIGN PATENT DOCUMENTS

JP    S 61-231733 A    10/1986
JP    H 02-250261 A    10/1990
(Continued)

OTHER PUBLICATIONS

International Search Report (ISR) (PCT Form PCT/ISA/210), in PCT/JP2013/072901, dated Oct. 8, 2013.
(Continued)

*Primary Examiner* — Imran Akram
(74) *Attorney, Agent, or Firm* — McGinn IP Law Group, PLLC.

(57) ABSTRACT

At least a connector of a current collecting member that is welded to an electrode plate of an electrode assembly is constituted by a rolled material, and the current collecting member and the electrode assembly are bonded to each other by vibration welding.

16 Claims, 18 Drawing Sheets

(51) Int. Cl.
   *H01M 2/30* (2006.01)
   *B23K 20/10* (2006.01)
   *H01M 4/66* (2006.01)
   *H01M 10/052* (2010.01)

(52) U.S. Cl.
   CPC ............ *H01M 4/66* (2013.01); *H01M 10/04* (2013.01); *H01M 10/0431* (2013.01); *H01L 2924/00014* (2013.01); *H01M 10/052* (2013.01); *Y10T 29/49108* (2015.01)

(56) References Cited

U.S. PATENT DOCUMENTS

| | | | | |
|---|---|---|---|---|
| 6,202,915 | B1* | 3/2001 | Sato | B23K 20/10 156/73.1 |
| 6,214,490 | B1* | 4/2001 | Pate | H01M 2/263 429/235 |
| 6,313,407 | B1* | 11/2001 | Shinchi | B29C 65/08 174/84 R |
| 8,408,445 | B1* | 4/2013 | Cai | B23K 20/26 156/73.5 |
| 8,673,470 | B2 | 3/2014 | Aota et al. | |
| 2002/0061438 | A1 | 5/2002 | Inoue et al. | |
| 2002/0130159 | A1* | 9/2002 | Kondo | B23K 20/10 228/110.1 |
| 2004/0131930 | A1* | 7/2004 | Nakanishi | H01M 2/263 429/161 |
| 2004/0214406 | A1* | 10/2004 | Kurita | B23K 20/10 438/455 |
| 2004/0247998 | A1* | 12/2004 | Nakanishi | H01M 2/263 429/161 |
| 2007/0196732 | A1* | 8/2007 | Tatebayashi | H01M 2/263 429/181 |
| 2009/0004562 | A1 | 1/2009 | Inagaki et al. | |
| 2010/0140326 | A1* | 6/2010 | Ebihara | B23K 20/106 228/111.5 |
| 2011/0195286 | A1* | 8/2011 | Aota | H01M 2/263 429/94 |
| 2012/0264007 | A1 | 10/2012 | Sasaki et al. | |
| 2012/0264008 | A1 | 10/2012 | Okamoto et al. | |
| 2013/0052531 | A1 | 2/2013 | Yoshitake et al. | |
| 2013/0200752 | A1* | 8/2013 | Kuypers | H03H 9/02 310/320 |
| 2014/0072848 | A1* | 3/2014 | Hagiwara | H01M 4/04 429/94 |
| 2014/0193682 | A1* | 7/2014 | Suzuki | H01M 10/052 429/94 |

FOREIGN PATENT DOCUMENTS

| | | | |
|---|---|---|---|
| JP | 2000-164195 | A | 6/2000 |
| JP | 2001-167751 | A | 6/2001 |
| JP | 2001-176490 | A | 6/2001 |
| JP | 2001-243939 | A | 9/2001 |
| JP | 2003-197174 | A | 7/2003 |
| JP | 2004-071199 | A | 3/2004 |
| JP | 2004-259547 | A | 9/2004 |
| JP | 2005-216825 | A | 8/2005 |
| JP | 2007-026945 | A | 2/2007 |
| JP | 2008-186779 | A | 8/2008 |
| JP | 2009-032670 | A | 2/2009 |
| JP | 2009-105074 | A | 5/2009 |
| JP | 2010-097764 | A | 4/2010 |
| JP | 2010-097822 | A | 4/2010 |
| JP | 2010-0282846 | A | 12/2010 |
| JP | 2011-014276 | A | 1/2011 |
| JP | 2011-115814 | A | 6/2011 |
| JP | 2011-165437 | A | 8/2011 |
| JP | 2012-160311 | A | 8/2012 |
| JP | 2013-065552 | A | 4/2013 |

OTHER PUBLICATIONS

International Preliminary Report on Patentability (Chapter I) in Application No. PCT/JP2013/072901 with an English translation thereof.

* cited by examiner

ELECTRIC STORAGE DEVICE AND METHOD FOR PRODUCING ELECTRIC STORAGE DEVICE

CROSS-REFERENCE TO RELATED APPLICATION

This application claims priority to Japanese Patent Application No. 2012-200309, the disclosure of which is incorporated herein by reference in its entirety.

FIELD

The present invention relates to an electric storage device including an electrode assembly in which an electrode plate is layered and a current collecting member bonded to the electrode assembly, and to a method for producing the electric storage device.

BACKGROUND

In recent years, rechargeable electric storage devices such as battery cells (such as lithium ion battery cells and nickel hydrogen battery cells) and capacitors (such as electric double layer capacitors) have been employed as a power source, for example, for vehicles (such as automobiles and motorcycles) and various equipment (such as mobile terminals and laptop computers).

Such an electric storage device generally includes external terminals to which conductors such as cables and bus bars are connected, an electrode assembly in which electrode plates are multilayered, and current collecting members that electrically connect the electrode assembly to the external terminals.

The electrode assembly includes a positive electrode plate and a negative electrode plate. The positive electrode plate and the negative electrode plate are layered together while they are insulated from each other. The positive electrode plate and the negative electrode plate are arranged to be displaced from each other in the width direction. This allows a projection in which only the positive electrode plate is layered to be formed at one end in the width direction of the electrode assembly and a projection in which only the negative electrode plate is layered to be formed at the other end in the width direction of the electrode assembly.

The electric storage device includes a positive current collecting member bonded to the positive electrode plate (projection) and a negative current collecting member bonded to the negative electrode plate (projection). These current collecting members have a common basic configuration. Each of the current collecting members has a connector welded to one of the electrode plates (the positive electrode plate or the negative electrode plate).

A specific description is given below. The current collecting member includes a current collector that is arranged along the electrode plate (the positive electrode plate or the negative electrode plate) of the electrode assembly and is electrically connected to the external terminal. Such a current collecting member of this type includes a backing member or a clip member in addition to the current collector. The backing member is arranged along the electrode plate (the positive electrode plate or the negative electrode plate) of the electrode assembly. The clip member has a pair of facing pieces facing each other with the electrode plate (the positive electrode plate or the negative electrode plate) of the electrode assembly interposed therebetween. The current collector is stacked on one of the pair of facing pieces.

In a current collecting member including the backing member, the portion of the current collector that extends along the electrode plate and the backing member are bonded (welded) to the electrode plate as a connector so as to be conductible. Further, in a current collecting member including the clip member, the portion of the current collector that extends along the electrode plate and the pair of facing pieces are bonded (welded) to the electrode plate as a connector so as to be conductible.

In such an electric storage device of this type, the electrode assembly and the current collecting member are welded together by vibration welding. Vibration welding is a welding method in which, while welding objects are stacked together, vibration is applied to the objects, so that the two objects are fused (welded). Ultrasonic vibration welding is widely adopted as one of vibration welding. Such ultrasonic vibration welding uses a horn to which ultrasonic vibration is applied, and an anvil that sandwiches the welding objects with the horn. In the electric storage device having the aforementioned configuration, while the electrode plate (projection) of the electrode assembly and the connector of the current collecting member are sandwiched by the horn and the anvil, ultrasonic vibration is applied to the horn. Thus, the electrode assembly (electrode plate) and the current collecting member (connector) are welded together.

In vibration welding, two welding objects are fused by application of vibration to the welding objects so as to generate friction between the welding objects stacked together. Therefore, the welding objects do not appropriately fuse together, if vibration energy does not efficiently propagate to the welding objects. Accordingly, in the production process of the electric storage device, there are cases where the electrode assembly (electrode plate) and the current collecting member (connector) do not sufficiently fuse (penetrate) together even if they are subjected to vibration welding. As a result, in the electric storage device of this type, there is a concern that a bonding failure between the electrode assembly and the current collecting member occurs. Further, it is another concern that such a bonding failure causes damage to the electrode plate of the electrode assembly.

CITATION LIST

Patent Literature

Patent Literature 1: JP 2005-216825 A

SUMMARY

Technical Problem

It is therefore an object of the present invention to provide an electric storage device that can eliminate the bonding failure in vibration welding between the electrode assembly and the current collecting member, and can ensure the electrical and mechanical connection between the electrode assembly and the current collecting member, and to provide a method for producing the electric storage device.

Solution to Problem

An electric storage device according to the present invention includes: an external terminal; an electrode assembly in which an electrode plate is layered; and a current collecting member that electrically connect the electrode assembly to the external terminal, the current collecting member having a connector welded to the electrode plate by vibration welding, wherein at least the connector of the current collecting member is constituted by a rolled material.

According to an aspect, the electric storage device according to the present invention may have a configuration in which the connector has a rolling direction corresponding to an amplitude direction of vibration to be applied in the vibration welding.

Here, the concept that "the connector has a rolling direction corresponding to an amplitude direction of vibration to be applied in the vibration welding" includes not only the state where the rolling direction of the connector coincides with the amplitude direction of vibration, but also the state where the rolling direction of the connector is inclined to the amplitude direction of vibration, within the range in which the stretching of the connector does not significantly attenuate the vibration.

According to another aspect, the electric storage device according to the present invention may have a configuration in which the vibration welding is ultrasonic vibration welding, in which the electrode plate and the connector are welded together by application of ultrasonic vibration to a horn sandwiching the electrode plate and the connector with an anvil, and the connector serves as a part facing the horn in the ultrasonic vibration welding.

In these cases, the configuration may be such that the current collecting member includes: a current collector that is arranged along the electrode plate of the electrode assembly and is electrically connected to the external terminal; and a clip member having a pair of facing pieces facing each other with the electrode plate interposed therebetween, the current collector being stacked on one of the pair of facing pieces, and the connector is a portion of the current collector that extends along the electrode plate or one of the pair of facing pieces.

Further, the configuration may be such that the current collecting member includes: a current collector that is arranged along the electrode plate of the electrode assembly and is electrically connected to the external terminal; and a backing member arranged along the electrode plate of the electrode assembly, and the connector is a portion of one of the current collector and the backing member that extend along the electrode plate.

A method for producing an electric storage device according to the present invention, in which the electric storage device includes: an external terminal; an electrode assembly in which an electrode plate is layered; and a current collecting member that electrically connects the electrode assembly to the external terminal, the current collecting member having a connector welded to the electrode plate by vibration welding, includes constituting at least the connector of the current collecting member by a rolled material.

According to an aspect, the method for producing an electric storage device according to the present invention may be configured so that the connector is welded to the electrode plate by vibration welding in the state where the connector has a rolling direction corresponding to an amplitude direction of vibration in the vibration welding.

Here, the concept that "the connector has a rolling direction corresponding to an amplitude direction of vibration to be applied in the vibration welding" includes not only the state where the rolling direction of the connector coincides with the amplitude direction of vibration, but also the state where the rolling direction of the connector is inclined to the amplitude direction of vibration, within the range in which the stretching of the connector does not significantly attenuate the vibration.

According to another aspect, the method for producing an electric storage device according to the present invention may be configured so that the vibration welding is ultrasonic vibration welding, in which the electrode plate and the connector are welded together by application of ultrasonic vibration to a horn sandwiching the electrode plate and the connector with an anvil, and the horn faces the connector in the ultrasonic vibration welding.

In these cases, the configuration may be such that the current collecting member includes: a current collector that is arranged along the electrode plate of the electrode assembly and is electrically connected to the external terminal; and a clip member having a pair of facing pieces facing each other with the electrode plate interposed therebetween, the current collector being stacked on one of the pair of facing pieces, and the connector is a portion of the current collector that extends along the electrode plate or one of the pair of facing pieces.

Further, the configuration may be such that the current collecting member includes: a current collector that is arranged along the electrode plate of the electrode assembly and is electrically connected to the external terminal; and a backing member arranged along the electrode plate of the electrode assembly, and the connector is a portion of one of the current collector and the backing member that extend along the electrode plate.

DESCRIPTION OF EMBODIMENTS

Figure 1:
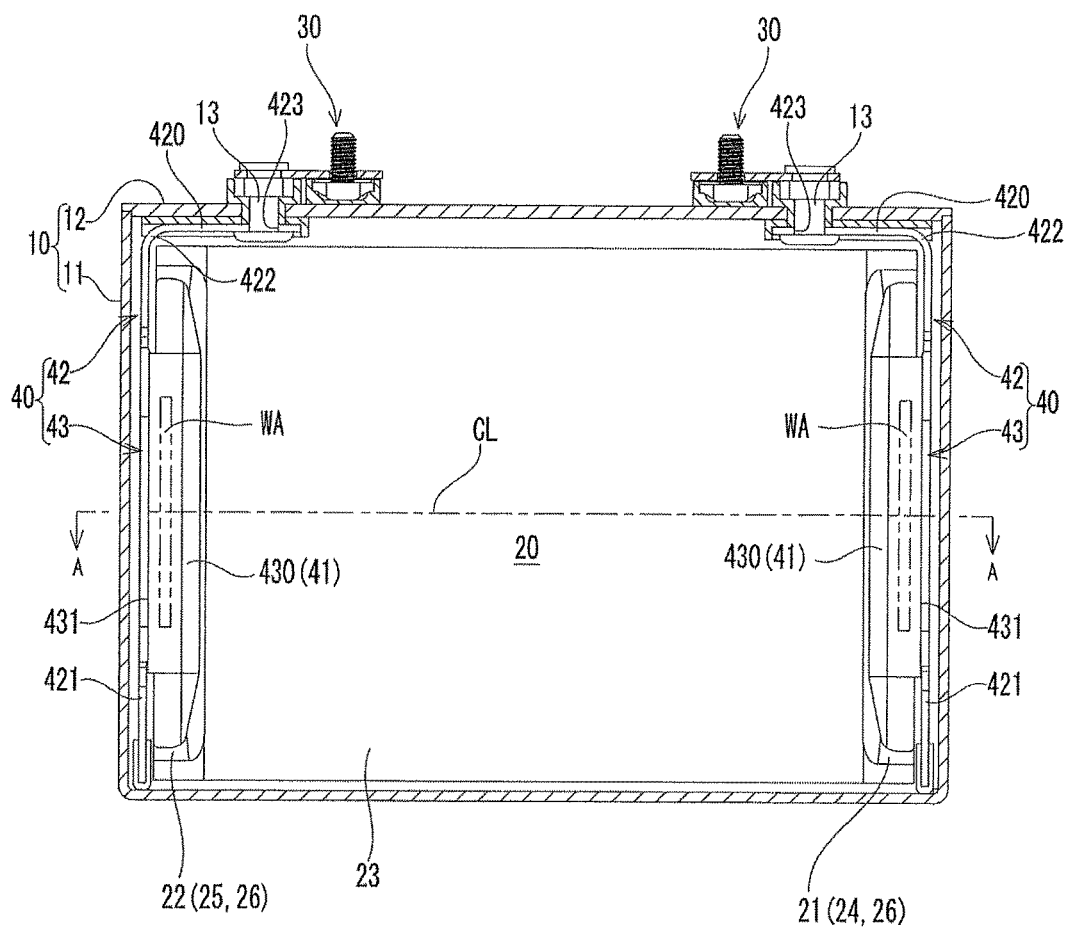
FIG. 1 is a partially cutaway front view of a battery cell according to an embodiment of the present invention.

The electric storage device according to the present invention includes: an external terminal; an electrode assembly in which an electrode plate is layered; and a current collecting member that electrically connects the electrode assembly to the external terminal, the current collecting member having a connector welded to the electrode plate by vibration welding, wherein at least the connector of the current collecting member is constituted by a rolled material.

In the electric storage device having the aforementioned configuration, the connector to be welded to the electrode assembly by vibration welding is constituted by a rolled material to which vibration easily propagates, and therefore the electrical and mechanical connection between the electrode assembly and the current collecting member is sufficiently ensured. A specific description is given below.

Rolled materials formed by rolling have properties of easily stretching in a specific direction and easily transferring vibration applied, as compared to isotropic materials such as forged materials formed by forging and cut materials formed by cutting. Therefore, vibration efficiently propagates to the electrode plate through the connector, when the current collecting member and the electrode plate are welded together by vibration welding in production, by constituting at least the connector of the current collecting member using a rolled material. As a result, the electrical and mechanical connection between the electrode assembly and the current collecting member can be obtained sufficiently and reliably in the electric storage device.

In this case, it is preferable that a rolling direction of the connector correspond to an amplitude direction of vibration to be applied in the vibration welding. Here, the concept that "a rolling direction of the connector correspond to an amplitude direction of vibration to be applied in the vibration welding" includes not only the state where the rolling direction of the connector coincides with the amplitude direction of vibration, but also the state where the rolling direction of the connector is inclined to the amplitude direction of vibration, within the range in which the stretching of the connector does not significantly attenuate the vibration.

According to the electric storage device having the aforementioned configuration, the connector stretches in a direction corresponding to the amplitude direction of vibration in vibration welding in production. That is, the connector is constituted by a rolled material, thereby allowing the connector to have properties of easily stretching in the rolling direction. Therefore, the connector stretches in the rolling direction due to application of pressure that causes a contact force that brings the electrode plate and the connector into pressure contact to act in vibration welding. At this time, the connector stretches in a direction corresponding to the amplitude direction of vibration, and thus vibration energy in vibration welding propagates to the connector and the electrode plate without a significant reduction.

A specific description is given below. If the connector stretches in a direction that does not correspond to the amplitude direction of vibration, the stretching of the connector attenuates the vibration because of the non-coincidence of the stretching direction of the connector and the amplitude direction of vibration. Therefore, vibration energy does not efficiently propagate to the connector and the electrode plate. In contrast, when the connector stretches in a direction corresponding to the amplitude direction of vibration, the stretching of the connector maintains or amplifies the vibration because of the coincidence of the stretching direction of the connector and the amplitude direction of vibration. Therefore, vibration energy efficiently propagates to the connector and the electrode plate. As a result, the connector and the electrode plate are efficiently fused together so as to be reliably bonded together.

According to an aspect, the electric storage device according to the present invention may have a configuration in which the vibration welding is ultrasonic vibration welding, in which the electrode plate and the connector are welded together by application of ultrasonic vibration to a horn sandwiching the electrode plate and the connector with an anvil, and the connector serves as a part facing the horn in the ultrasonic vibration welding.

In this way, the electrode plate and the connector are sandwiched by the horn and the anvil, and a pressure is applied to the connector. Therefore, while the connector stretches in a direction corresponding to the amplitude direction of ultrasonic vibration in the state where the electrode plate and the connector are in pressure contact with each other, the electrode plate and the connector receive vibration from the horn in ultrasonic vibration welding. Accordingly, the stretching of the connector maintains or amplifies the vibration because of the coincidence of the stretching direction of the connector and the amplitude direction of vibration, and vibration energy efficiently propagates to the connector and the electrode plate. As a result, the connector and the electrode plate are efficiently fused together so as to be reliably bonded together.

In these cases, the configuration may be such that the current collecting member includes: a current collector that is arranged along the electrode plate of the electrode assembly and is electrically connected to the external terminal; and a clip member having a pair of facing pieces facing each other with the electrode plate interposed therebetween, the current collector being stacked on one of the pair of facing pieces, and the connector is a portion of the current collector that extends along the electrode plate or one of the pair of facing pieces.

In this way, vibration is not applied directly to the electrode plate in vibration welding. Accordingly, even if the electrode plate is constituted by a thin metal foil, damage (breakage) of the electrode plate due to the influence of vibration can be prevented. Further, the electrode plate of the electrode assembly is surrounded by the clip member. Accordingly, protection of the electrode plate of the electrode assembly is also possible.

Further, the configuration may be such that the current collecting member includes: a current collector that is arranged along the electrode plate of the electrode assembly and is electrically connected to the external terminal; and a backing member arranged along the electrode plate of the electrode assembly, and the connector is a portion of one of the current collector and the backing member that extend along the electrode plate.

In this way, vibration is not applied directly to the electrode plate in vibration welding. Accordingly, even if the electrode plate is constituted by a thin metal foil, damage (breakage) of the electrode plate due to the influence of vibration can be prevented.

A method for producing an electric storage device according to the present invention, in which the electric storage device includes: an external terminal; an electrode assembly in which an electrode plate is layered; and a current collecting member that electrically connects the electrode assembly to the external terminal, the current collecting member having a connector welded to the electrode plate by vibration welding, includes constituting at least the connector of the current collecting member by a rolled material.

In the method for producing an electric storage device configured as above, the connector to be welded to the electrode assembly by vibration welding is constituted by a rolled material to which vibration easily propagates, and therefore the electrical and mechanical connection between the electrode assembly and the current collecting member can be sufficiently ensured by vibration welding. A specific description is given below.

Rolled materials have properties of easily stretching in a specific direction and easily transferring vibration applied, as compared to isotropic materials such as forged materials formed by forging and cut materials formed by cutting. Therefore, vibration efficiently propagates to the electrode plate through the connector by constituting at least the connector of the current collecting member using a rolled material, when the current collecting member and the electrode plate are welded together by vibration welding. As a result, the electrical and mechanical connection between the electrode assembly and the current collecting member can be obtained sufficiently and reliably in the produced electric storage device.

In this case, it is preferable that the connector be welded to the electrode plate by vibration welding in the state where the connector has a rolling direction corresponding to an amplitude direction of vibration in the vibration welding. Here, the concept that "the connector has a rolling direction corresponding to an amplitude direction of vibration to be applied in the vibration welding" includes not only the state where the rolling direction of the connector coincides with the amplitude direction of vibration, but also the state where the rolling direction of the connector is inclined to the amplitude direction of vibration, within the range in which the stretching of the connector does not significantly attenuate the vibration.

According to the method for producing an electric storage device, the connector stretches in a direction corresponding to the amplitude direction of vibration in the vibration welding. That is, the connector is constituted by a rolled material, thereby allowing the connector to have properties of easily stretching in the rolling direction. Therefore, the connector stretches in the rolling direction due to application of pressure that causes a contact force that brings the electrode plate and the connector into pressure contact to act in vibration welding. Accordingly, the connector stretches in a direction corresponding to the amplitude direction of vibration, and thus vibration energy in vibration welding propagates to the connector and the electrode plate without a reduction.

A specific description is given below. If the connector stretches in a direction that does not correspond to the amplitude direction of vibration, the stretching of the connector attenuates the vibration because of the non-coincidence of the stretching direction of the connector and the amplitude direction of vibration. Therefore, vibration energy does not efficiently propagate to the connector and the electrode plate. In contrast, when the connector stretches in a direction corresponding to the amplitude direction of vibration, the stretching of the connector maintains or amplifies the vibration because of the coincidence of the stretching direction of the connector and the amplitude direction of vibration. Therefore, vibration energy efficiently propagates to the connector and the electrode plate. As a result, the connector and the electrode plate are efficiently fused together so as to be reliably bonded together.

According to an aspect, the method for producing an electric storage device according to the present invention may be such that the vibration welding is ultrasonic vibration welding, in which the electrode plate and the connector are welded together by application of ultrasonic vibration to a horn sandwiching the electrode plate and the connector with an anvil, and the horn faces the connector in the ultrasonic vibration welding.

In this way, while the electrode plate and the connector are sandwiched by the horn and the anvil, a pressure is applied to the connector in ultrasonic vibration welding. Therefore, while the connector stretches in a direction corresponding to the amplitude direction of ultrasonic vibration in the state where the electrode plate and the connector are in pressure contact with each other, the electrode plate and the connector receive vibration from the horn in ultrasonic vibration welding. Accordingly, the stretching of the connector maintains or amplifies the vibration because of the coincidence of the stretching direction of the connector and the amplitude direction of vibration. Therefore, vibration energy efficiently propagates to the connector and the electrode plate. As a result, the connector and the electrode plate are efficiently fused together so as to be reliably bonded together without damage.

In these cases, the configuration may be such that the current collecting member includes: a current collector that is arranged along the electrode plate of the electrode assembly and is electrically connected to the external terminal; and a clip member having a pair of facing pieces facing each other with the electrode plate interposed therebetween, the current collector being stacked on one of the pair of facing pieces, and the connector is a portion of the current collector that extends along the electrode plate or one of the pair of facing pieces.

In this way, vibration is not applied directly to the electrode plate in vibration welding. Accordingly, even if the electrode plate is constituted by a thin metal foil, damage (breakage) of the electrode plate due to the influence of vibration can be prevented. Further, the electrode plate of the electrode assembly is surrounded by the clip member. Accordingly, protection of the electrode plate of the electrode assembly is also possible.

Further, the configuration may be such that the current collecting member includes: a current collector that is arranged along the electrode plate of the electrode assembly and is electrically connected to the external terminal; and a backing member arranged along the electrode plate of the electrode assembly, and the connector is a portion of one of the current collector and the backing member that extend along the electrode plate.

In this way, vibration is not applied directly to the electrode plate in vibration welding. Accordingly, even if the electrode plate is constituted by a thin metal foil, damage (breakage) of the electrode plate due to the influence of vibration can be prevented.

Hereinafter, an electric storage device according to an embodiment of the present invention is described with reference to the drawings. In this embodiment, a rechargeable secondary battery cell (hereinafter, referred to simply as "battery cell") to be employed as a power source for vehicles (such as automobiles and motorcycles), various equipment (such as mobile terminals and laptop computers), or the like is described as an example of the electric storage device.

Figure 2:
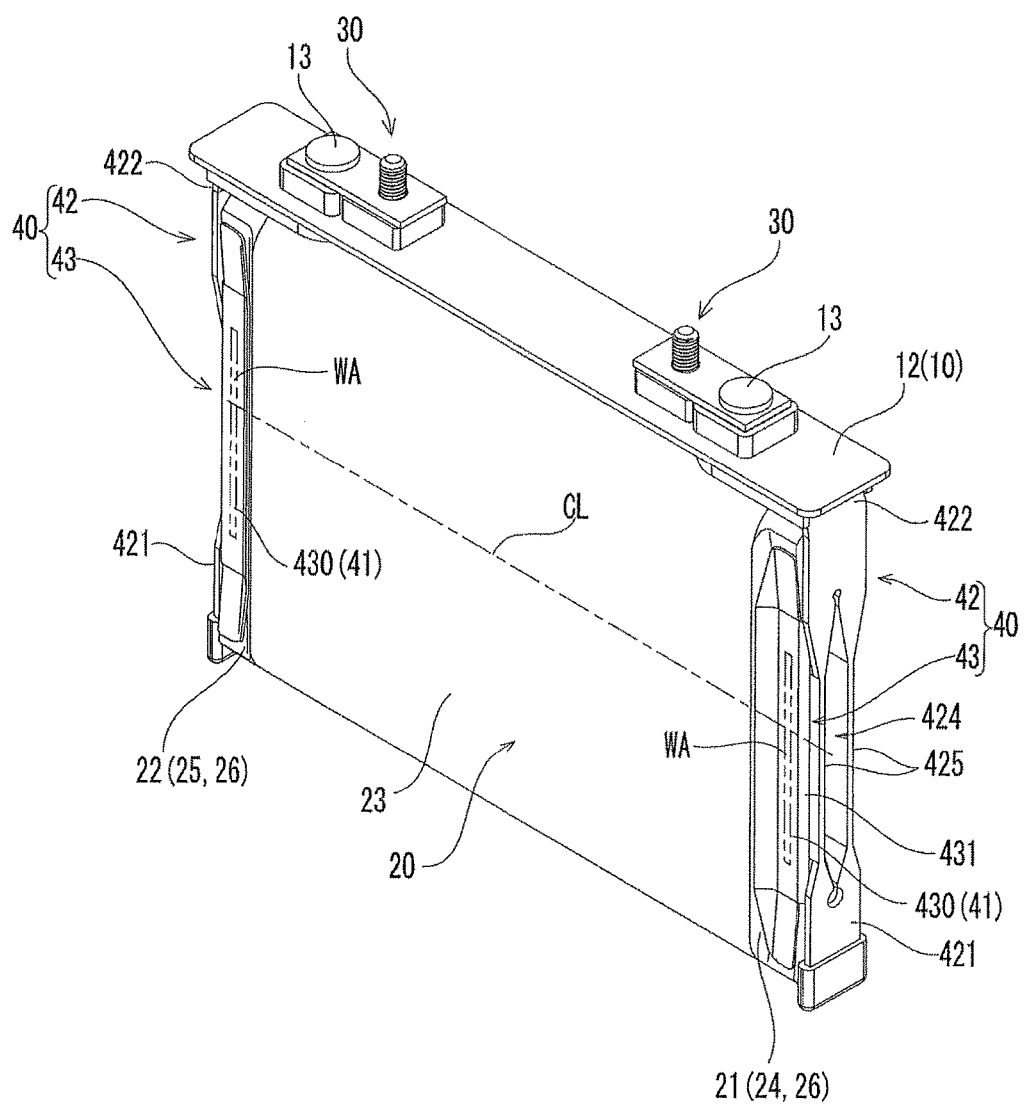
FIG. 2 shows a perspective view of a structure within a case of the battery cell.

The battery cell according to this embodiment is a lithium ion secondary battery cell. As shown in FIG. 1 and FIG. 2, the battery cell includes a case 10 made of metal, an electrode assembly 20 housed inside the case 10, external terminals 30 arranged outside the case 10, and current collecting members 40 configured to electrically connect the electrode assembly 20 to the external terminals 30.

The case 10 includes a bottomed rectangular cylindrical case body 11 having an opening, and a cover plate 12 closing the opening of the case body 11. The case body 11 and the cover plate 12 are integrated by welding of their circumferential edges in the state where they are combined together. This allows the case 10 to be air tight and liquid tight.

The external terminals 30 are parts to which conductors (not shown) such as cables and bus bars are connected. The battery cell according to this embodiment is provided with a positive external terminal 30 and a negative external terminal 30. The positive external terminal 30 and the negative external terminal 30 have a common configuration. The positive external terminal 30 and the negative external terminal 30 are electrically connected to the electrode assembly 20 while they are fixed to the case 10 in the state of being insulated from the case 10. The external terminals 30 of this embodiment are fixed to the case 10 via rivets 13 passing through the case 10 (the cover plate 12). The rivets 13 fix the external terminals 30 to the case 10. Further, the rivets 13 have a function of conductively connecting the current collecting members 40 to the external terminals 30 while fixing the current collecting members 40 to the case 10.

Figure 3:
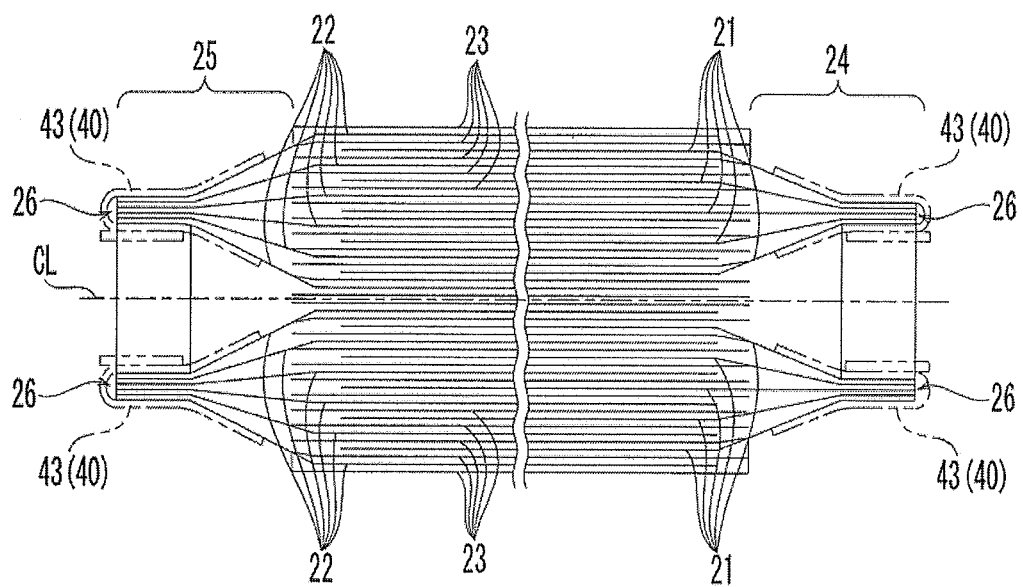
FIG. 3 shows a schematic sectional view showing electrode plates and a separator in a simplified manner for explaining an electrode assembly of the battery cell.

In the electrode assembly 20, electrode plates are layered. Specifically, as shown in FIG. 3, the electrode assembly 20 includes a positive electrode plate 21 and a negative electrode plate 22. More specifically, the electrode assembly 20 includes the positive electrode plate 21, the negative electrode plate 22, and a separator 23. The positive electrode plate 21 and the negative electrode plate 22 are layered together with the separator 23 interposed therebetween. The positive electrode plate 21 and the negative electrode plate 22 of this embodiment each have a strip shape. The positive electrode plate 21 and the negative electrode plate 22 are layered with the separator 23 interposed therebetween, and are wound into a flat shape.

The positive electrode plate 21 and the negative electrode plate 22 are arranged so as to be displaced from each other in the width direction (in a direction orthogonal to their longitudinal direction). This allows the electrode assembly 20 to have a projection 24 formed only of the positive electrode plate 21 projecting at one end in the width direction and a projection 25 formed only of the negative electrode plate 22 projecting at the other end in the width direction. That is, in the electrode assembly 20 according to this embodiment, the projection 24 in which only the positive electrode plate 21 is layered is formed at one end in the width direction, and the projection 25 in which only the negative electrode plate 22 is layered is formed at the other end in the width direction. As shown in FIG. 1, the electrode assembly 20 is housed within the case 10 so as to have a winding center line CL that is parallel to a surface of the case 10 (the inner surface of the cover plate 12) through which the rivets 13 are inserted.

The battery cell includes a positive current collecting member 40 and a negative current collecting member 40. The positive current collecting member 40 connects the positive electrode plate 21 to the positive external terminal 30. The negative current collecting member 40 connects the negative electrode plate 22 to the negative external terminal 30. The positive current collecting member 40 and the negative current collecting member 40 are formed into the same shape. The current collecting members 40 each have a connector 41 welded to the electrode plate 21 or 22 by vibration welding. In the current collecting members 40, at least the connectors 41 are constituted by rolled materials. The rolling directions of the connectors 41 correspond to the amplitude direction of vibration to be applied in vibration welding.

Figure 4:
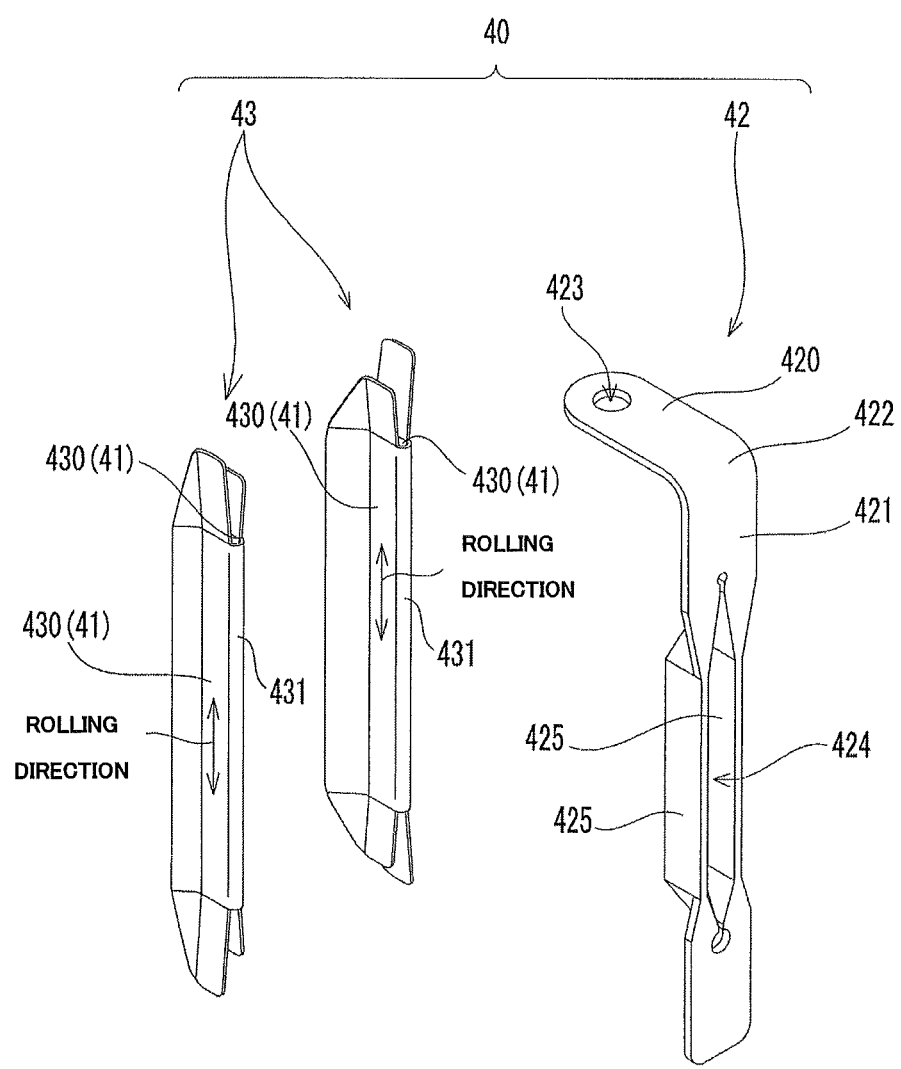
FIG. 4 shows an exploded perspective view of a current collecting member of the battery cell.

A specific description is given below. As shown in FIG. 4, the current collecting members 40 each include a current collector 42 and clip members 43.

The current collector 42 is arranged along the electrode plate 21 or 22 of the electrode assembly 20 and is electrically connected to one of the external terminals 30. The current collector 42 includes an internal connector 420 to be connected to the external terminal 30, an electrode attachment 421 to be bonded directly or indirectly to the projection 24 or 25 of the electrode assembly 20, and an intermediate part 422 connecting the internal connector 420 and the electrode attachment 421. The current collector 42 is formed into an L-shape deformed in front view by bending a plate-shaped metal material that has been cut into a specific shape. Generally, aluminum or aluminum alloy, for example, is employed as a metal material for the positive current collector 42. Further, copper or copper alloy, for example, is employed as a metal material for the negative current collector 42.

The current collector 42 is bent at the intermediate part 422. Thus, the internal connector 420 is oriented in a direction perpendicular (L-shape in front view) to the electrode attachment 421. The internal connector 420 is arranged along the inner surface of the case 10 while being insulated from the inner surface of the case 10. A through hole 423 through which one of the rivets 13 configured to connect the external terminals 30 (see FIG. 1 and FIG. 2) is inserted is provided at the tip of the internal connector 420.

The electrode attachment 421 is arranged between the projection 24 or 25 of the electrode assembly 20 and the inner surface of the case 10 (see FIG. 1). The electrode attachment 421 has an opening 424. Two connection pieces 425 extending in the same direction as the internal connector 420 are provided on both sides of the opening 424.

Figure 5:
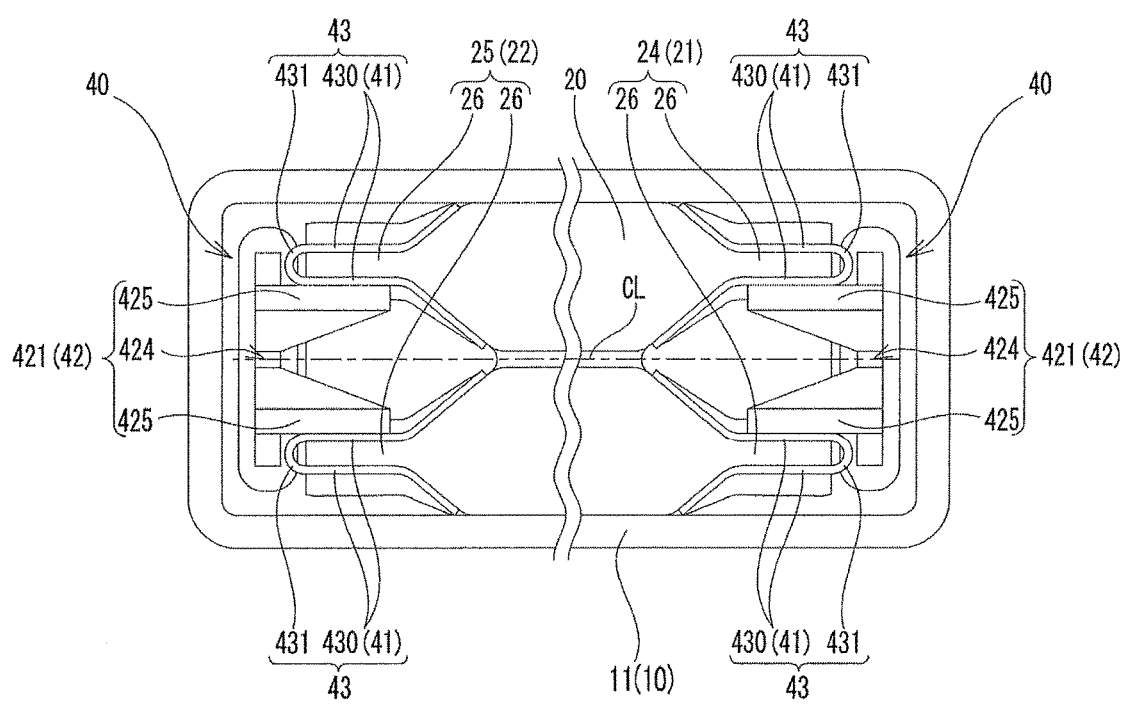
FIG. 5 shows a sectional view taken along the line A-A in FIG. 1.

As shown in FIG. 2, the electrode assembly 20 according to this embodiment is formed by winding the positive electrode plate 21 and the negative electrode plate 22 into a flat shape. Therefore, the electrode assembly 20 has a minor axis and a major axis as viewed in the direction of the winding center line CL. As shown in FIG. 3, the projections 24 and 25 of the electrode assembly 20 each have two layered parts 26 formed with the winding center line CL of the electrode assembly 20 interposed therebetween in the minor axis direction. Therefore, as shown in FIG. 4 and FIG. 5, the electrode attachment 421 includes a connection piece 425 that is bonded to one of the two layered parts 26 and a connection piece 425 that is bonded to the other of the two layered parts 26. Each of the two connection pieces 425 extends along the major axis direction of the electrode assembly 20 in the direction in which the winding center line CL of the electrode assembly 20 extends. The two connection pieces 425 of this embodiment are stacked on the layered parts 26 to which they respectively correspond when being inserted into the center part of the projection 24 or 25 of the electrode assembly 20. The opening 424 and the connection pieces 425 are formed, for example, by forming a slit in the length direction in a strip plate before the electrode attachment 421 is formed and twisting both sides of the slit.

The clip members 43 sandwich the electrode plate 21 or 22 of the electrode assembly 20 and connect the electrode assembly 20 to the current collector 42. The clip members 43 each have a pair of facing pieces 430 facing each other with the electrode plate 21 or 22 of the electrode assembly 20 (the projection 24 or 25) interposed therebetween. A specific description is given below. The clip members 43 each have the pair of facing pieces 430 facing each other at an interval, and a coupling part 431 coupling the corresponding ends of the pair of facing pieces 430. In this embodiment, the pair of facing pieces 430 serve as the connectors 41 bonded to the electrode plate 21 or 22 of the electrode assembly 20.

In this embodiment, the projection 24 or 25 of the electrode assembly 20 is composed of the two layered parts 26, and therefore the current collector 42 includes the two connection pieces 425 corresponding respectively to the two layered parts 26. Therefore, the positive current collecting member 40 and the negative current collecting member 40 each include the two clip members 43 corresponding to the connection pieces 425 and the layered parts 26 so as to allow electrical connection of one of the layered parts 26 to one of the connection pieces 425 that corresponds to the layered part 26.

The clip members 43 according to this embodiment are each formed into a U-shape in cross section by bending a plate-shaped metal material. The metal material from which the clip members 43 are formed is a rolled material that has been rolled in one direction so as to be drawn.

In this embodiment, as shown in FIG. 5, the current collecting member 40 (the clip members 43 and the connection pieces 425 of the current collector 42) is welded to the electrode plate 21 or 22 of the electrode assembly 20 (the projection 24 or 25) by vibration welding. Therefore, the clip members 43 are each formed by bending a metal material so that the rolling direction of the metal material corresponds to the amplitude direction of vibration in vibration welding. The clip members 43 of this embodiment are formed so that the rolling direction of the metal material coincides with the amplitude direction of vibration.

The pair of facing pieces 430 of this embodiment are each formed to be longitudinal in the major axis direction of the electrode assembly 20. As shown in FIG. 1 and FIG. 2, the facing pieces 430 are welded to the electrode plate 21 or 22 and the connection pieces 425 by vibration welding so that welding areas WA extending in the major axis direction of the electrode assembly 20 (in the longitudinal direction of the facing pieces 430) are formed.

In this embodiment, vibration is applied to the facing pieces 430 in vibration welding so that the amplitude direction of vibration corresponds to the longitudinal direction of the facing pieces 430. Therefore, the clip members 43 are each subjected to bending so that the rolling direction of the facing pieces 430 corresponds to the amplitude direction of the vibration welding. That is, each of the clip members 43 (the pair of facing pieces 430 and the coupling part 431) is formed by bending a plate-shaped or a sheet-shaped rolled material in a direction orthogonal to the rolling direction. This allows the boundary (imaginary line) between each of the facing pieces 430 and the coupling part 431 to coincide with the rolling direction of the rolled material.

The clip members 43 according to this embodiment are each formed by bending one piece of rolled material, as mentioned above. Therefore, the pair of facing pieces 430 and the coupling part 431 of each of the clip members 43 have the same rolling direction. That is, the rolling direction of the pair of facing pieces 430 and the coupling part 431 coincides or substantially coincides with the direction that is orthogonal or substantially orthogonal to the bending direction of the metal material. It should be noted that the positive clip members 43, for example, are made of aluminum or aluminum alloy in the same manner as the positive current collector 42, and the negative clip members 43, for example, are made of copper or copper alloy in the same manner as the negative current collector 42.

Figure 6:
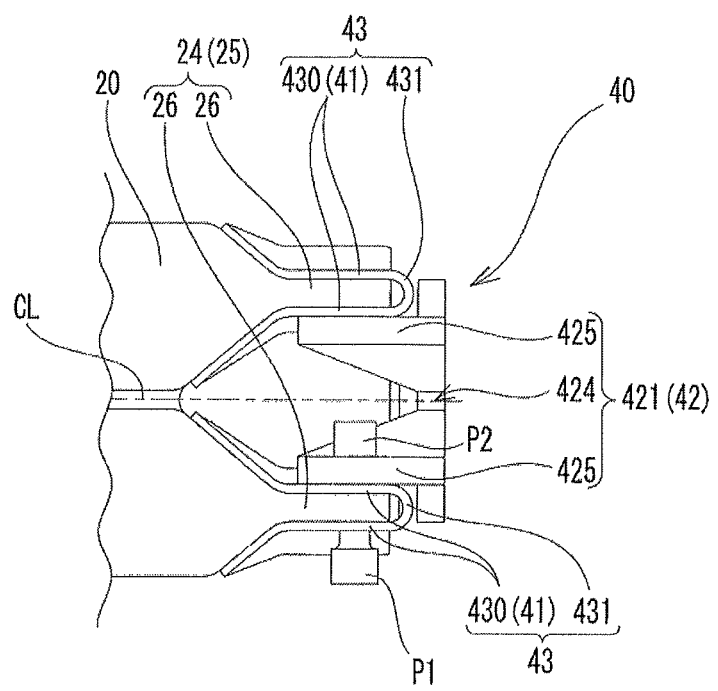
FIG. 6 shows a partial cross-sectional view of a production method of the battery cell (method for welding the electrode assembly to the current collecting member) including a part of the current collecting member and a part of the electrode assembly.

The battery cell according to this embodiment is as described above. Next, a production method of the battery cell is described. A general method is employed for coupling the current collector 42 or the external terminal 30 to the case 10 or for assembling the case 10. Hereinafter, only the bonding between the current collecting member 40 and the electrode assembly 20 is described. As shown in FIG. 6, the clip members 43 are first mounted on the projection 24 or 25 of the electrode assembly 20, and the connection pieces 425 of the current collector 42 are welded to the clip members 43.

A specific description is given below. The clip members 43 are respectively mounted on the pair of layered parts 26 constituting the projection 24 or 25. At this time, the facing pieces 430 of each of the clip members 43 sandwich their corresponding layered parts 26 (the electrode plate 21 or 22). With such a state, the pair of connection pieces 425 of the current collector 42 are inserted into the center part of the projection 24 or 25 of the electrode assembly 20 (between the pair of layered parts 26). This allows one of the connection pieces 425 to extend along one of the facing pieces 430 of one of the clip members 43, and the other of the connection pieces 425 to extend along one of the facing pieces 430 of the other of the clip members 43.

Figure 7:
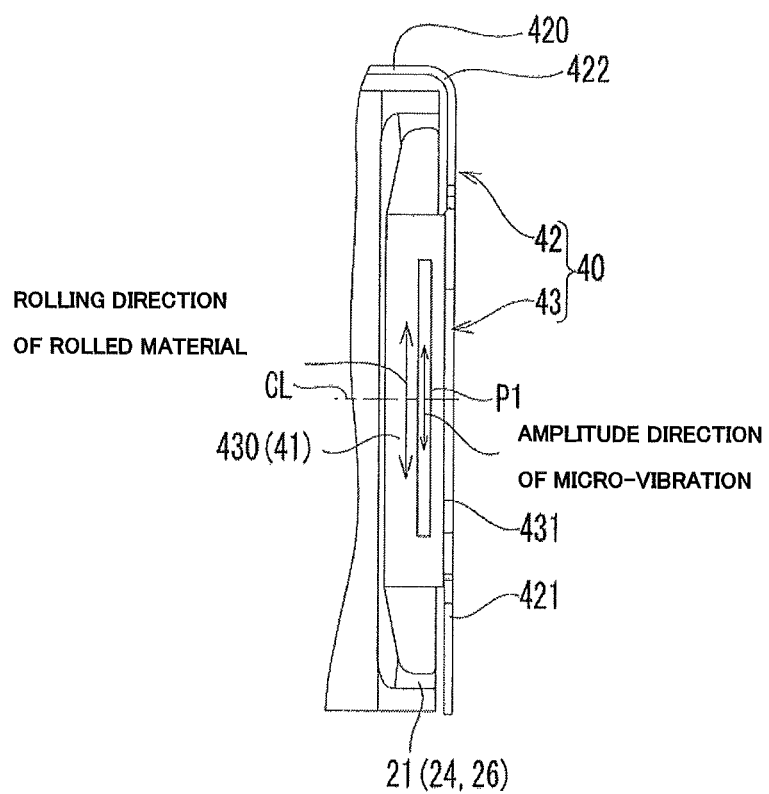
FIG. 7 shows a partial front view of the production method of the battery cell (method for welding the electrode assembly to the current collecting member) including a part of the current collecting member and a part of the electrode assembly.

In such a state, micro-vibration having an amplitude in a direction corresponding to the rolling direction is applied to the other of the facing pieces 430 of each of the clip members 43. Thus, the current collecting member 40 (the facing pieces 430 of the clip member 43 and the connection pieces 425 of the current collector 42) and the electrode plate 21 or 22 are welded together by vibration welding. At this time, as shown in FIG. 7, the facing pieces 430 (the connectors 41) of the clip member 43 stretch in a direction corresponding to the amplitude direction of vibration. That is, the facing pieces 430 of the clip member 43 serving as the connectors 41 are constituted by rolled materials, and therefore the facing pieces 430 easily stretch in the rolling direction. Hence, the facing pieces 430 (the connectors 41) of the clip member 43 stretch in the rolling direction, in vibration welding, due to application of pressure that causes a contact force that brings the electrode plate 21 or 22 into pressure contact with the facing pieces 430 (the connectors 41) of the clip member 43 to act. In this way, the facing pieces 430 (the connectors 41) of the clip member 43 stretch in a direction corresponding to the amplitude direction of vibration. Therefore, vibration energy in the vibration welding propagates to the connectors 41 and the electrode plate 21 or 22 without being reduced.

A specific description is given below. If the facing pieces 430 (the connectors 41) of the clip member 43 stretch in a direction that does not correspond to the amplitude direction of vibration, the stretching of the facing pieces 430 (the connectors 41) of the clip member 43 attenuates the vibration because of the non-coincidence of the stretching direction of the facing pieces 430 (the connectors 41) of the clip member 43 and the amplitude direction of vibration. This prevents efficient propagation of vibration energy to the facing pieces 430 (the connectors 41) of the clip member 43 and the electrode plate 21 or 22. In contrast, when the facing pieces 430 (the connectors 41) of the clip member 43 stretch in a direction corresponding to the amplitude direction of vibration, the stretching of the connectors 41 maintains or amplifies the vibration because of the coincidence of the stretching direction of the facing pieces 430 (the connectors 41) of the clip member 43 and the amplitude direction of vibration. This allows efficient propagation of vibration energy to the facing pieces 430 (the connectors 41) of the clip member 43 and the electrode plate 21 or 22. As a result, the facing pieces 430 (the connectors 41) of the clip member 43 are efficiently fused with the electrode plate 21 or 22 and reliably bonded thereto. Further, significant stress does not act directly on the electrode plate 21 or 22 during vibration welding. Therefore, damage to the electrode plate 21 or 22 is also prevented.

In this embodiment, as shown in FIG. 6, ultrasonic vibration welding in which objects are welded together by using a horn P1 and an anvil P2 and application of ultrasonic vibration to the horn P1 is employed as the vibration welding. Therefore, the horn P1 faces the facing pieces 430 of the clip member 43 that serve as the connectors 41 in ultrasonic vibration welding. More specifically, the anvil P2 is pressed against one of the connection pieces 425, the horn P1 (ultrasonic transducer) is pressed against one of the facing pieces 430 on the opposite side of the other of the facing pieces 430 on which the connection piece 425 is stacked.

Thus, the connection piece 425, the pair of facing pieces 430, and the electrode plate 21 or 22 of the projection 24 or 25 are sandwiched by the horn P1 and the anvil P2. In such a state, ultrasonic vibration is applied to the horn P1, thereby generating frictional heat. This allows the connection piece 425, the clip members 43 (the facing pieces 430), and the electrode plate 21 or 22 to be integrally welded. In this way, vibration is applied to the clip members 43 in this embodiment. Therefore, even if the electrode plate 21 or 22 is constituted by a thin metal foil, damage (breakage) to the electrode plate 21 or 22 due to the influence of vibration can be prevented. Further, the projection 24 or 25 of the electrode assembly 20 (the electrode plate 21 or 22) is surrounded by the clip members 43, and thus protection of the electrode plate 21 or 22 of the electrode assembly 20 is also possible.

The present invention is not limited to the aforementioned embodiment, and various modifications can be made without departing from the gist of the present invention.

In the aforementioned embodiment, the electrode assembly 20 of the wound type in which the positive electrode plate 21, the negative electrode plate 22, and the separator 23 are wound is employed. However, there is no limitation to this. For example, the electrode assembly 20 may be a stack of the positive electrode plate 21, the negative electrode plate 22, and the separator 23 that are each in the form of a sheet.

In the aforementioned embodiment, the clip members 43 constituting the current collecting member 40 are entirely constituted by rolled materials. However, there is no limitation to this. For example, the connectors 41 bonded to the electrode assembly 20 may have a configuration in which only the parts (the facing pieces 430) to which vibration is applied in vibration welding are constituted by rolled materials, and other parts are constituted by materials that are not rolled. That is, only the connectors 41 that are welded to the electrode assembly 20 (the electrode plate 21 or 22) by application of vibration in vibration welding may be constituted by rolled materials. Also in this case, it is preferable that the current collecting member 40 be arranged so that the rolling direction of the connectors 41 corresponds to the amplitude direction of vibration in vibration welding.

Further, in the aforementioned embodiment, only the clip members 43 of the current collecting member 40 are constituted by rolled materials. However, there is no limitation to this. For example, the following configuration may be employed for efficiently using vibration energy in vibration welding. All the welding objects to be stacked together (the connectors 41 of the current collecting member 40 and the electrode plate 21 or 22) are constituted by rolled materials, and all these welding objects are arranged so that their rolling directions correspond to each other. Further, their rolling directions are set to correspond to the amplitude direction of vibration in vibration welding. Then, the connectors 41 and the electrode plate 21 or 22 stretch in a direction corresponding to the amplitude direction of vibration by being sandwiched in vibration welding. As a result, vibration energy propagate entirely to the connectors and the electrode plate 21 or 22 (layered parts 26), thereby enabling efficient welding (fusion welding).

In the aforementioned embodiment, ultrasonic vibration welding is employed as an example of vibration welding. However, there is no limitation to this. For example, a method in which a plurality of welding objects are welded by applying mechanical micro-vibration to the outermost one of welding objects that are stacked together so as to cause friction between the welding objects stacked together may be employed. Also in this case, the same actions and effects as in the aforementioned embodiment can be obtained by using rolled materials for constituting the connectors 41 that are welded to the projection 24 or 25 of the electrode assembly 20 by application of vibration and setting their rolling directions to correspond to the amplitude direction of vibration.

Figure 8:
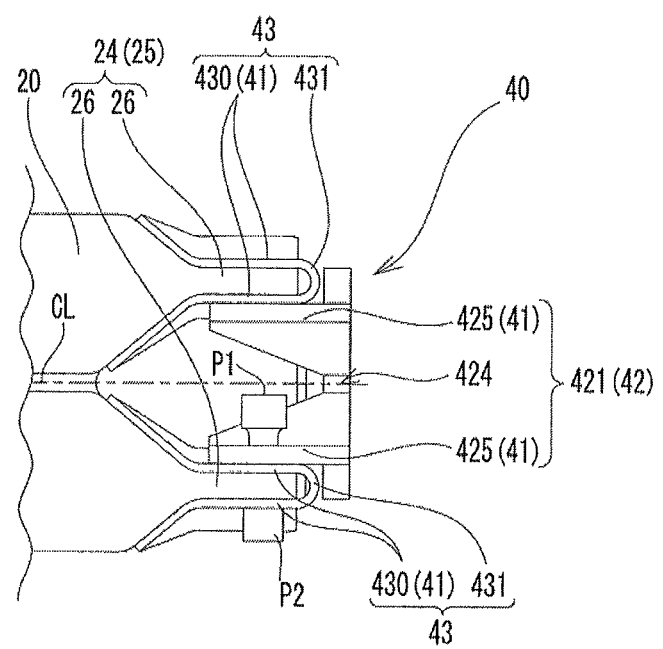
FIG. 8 shows a partial schematic cross-sectional view of a battery cell (a production method of the battery cell) according to another embodiment of the present invention, in which a layered part of an electrode assembly is sandwiched by a clip member, and a connection piece of a current collector is stacked on one of a pair of facing pieces of the clip member that is located on the inner side of the electrode assembly, which are welded together by vibration welding through application of micro-vibration to the connection piece.

In the aforementioned embodiment, the connection piece 425 of the current collector 42 is stacked on one of the facing pieces 430 of the clip member 43 sandwiching the projection 24 or 25 (layered part 26). Then, vibration is applied (ultrasonic vibration is applied by the horn P1) to the other of the facing pieces 430 of the clip member 43 that serve as the connectors 41 (the facing piece 430 located on the outer side). However, there is no limitation to this configuration. For example, as shown in FIG. 8, vibration may be applied to the connection piece 425 serving as a connector 41 without changing the arrangement of the connection piece 425 and the clip members 43 (that is, vibration is applied while the horn P1 is directly pressed against the connection piece 425, and the anvil P2 is pressed against the other of the facing pieces 430).

Figure 9:
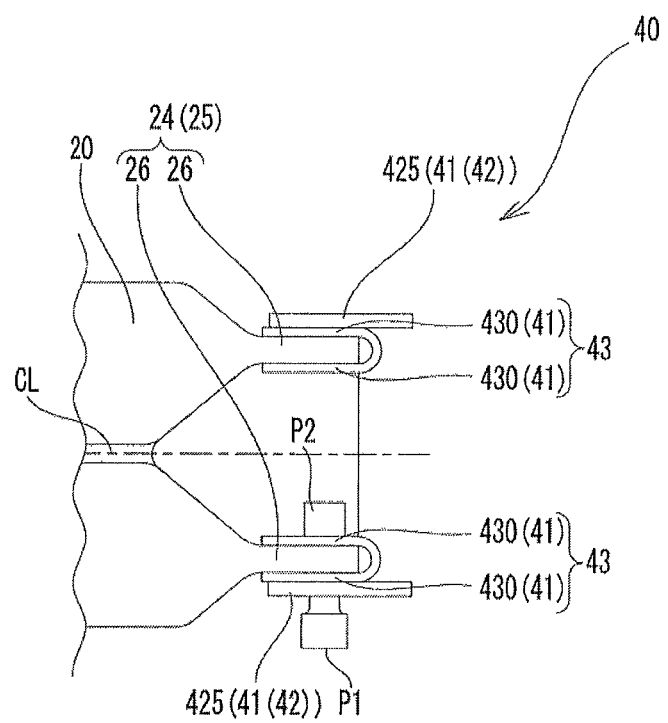
FIG. 9 shows a partial schematic cross-sectional view of a battery cell (a production method of the battery cell) according to still another embodiment of the present invention, in which a layered part of an electrode assembly is sandwiched by a clip member, and a connection piece of a current collector is stacked on one of a pair of facing pieces of the clip member that is located on the outer side of the electrode assembly, which are welded together by vibration welding through application of micro-vibration to the connection piece.
Figure 10:
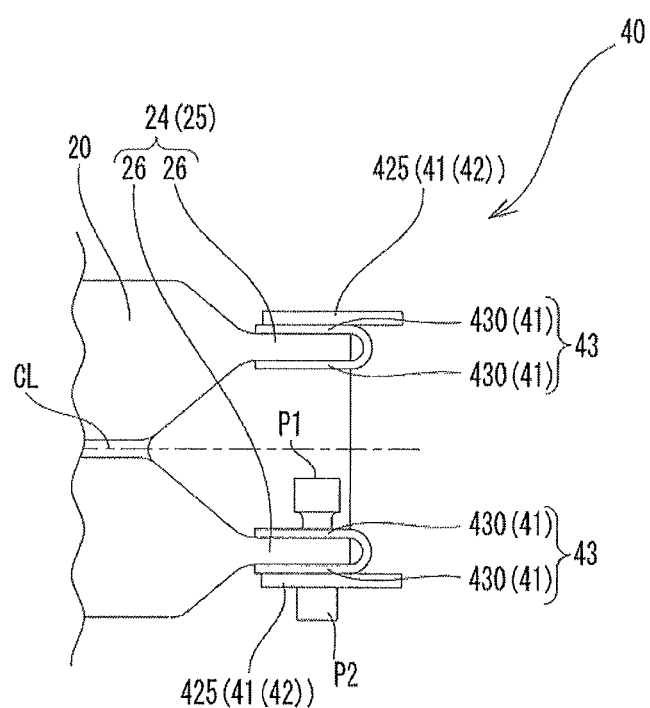
FIG. 10 shows a partial schematic cross-sectional view of the aforementioned battery cell (the aforementioned production method of the battery cell), in which the layered part of the electrode assembly is sandwiched by the clip member, and the connection piece of the current collector is stacked on one of the pair of facing pieces of the clip member that is located on the outer side of the electrode assembly, which are welded together by vibration welding through application of micro-vibration to the other of the pair of facing pieces that is located on the inner side (winding center side) of the electrode assembly.
Figure 11:
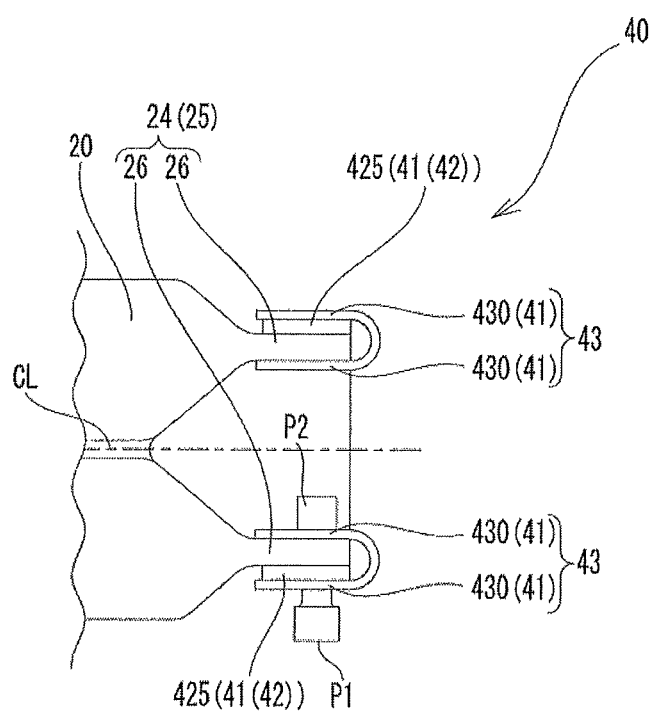
FIG. 11 shows a partial schematic cross-sectional view of a battery cell (a production method of the battery cell) according to still another embodiment of the present invention, in which a layered part of an electrode assembly and a connection piece of a current collector stacked on the outer side of the layered part are sandwiched by a clip member, which are welded together by vibration welding through application of micro-vibration to one of a pair of facing pieces of the clip member that is located on the outer side of the electrode assembly.
Figure 12:
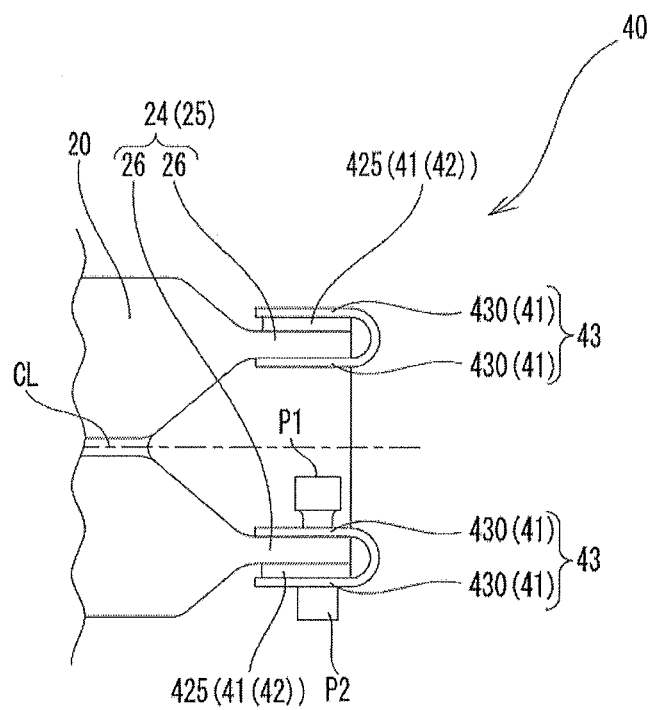
FIG. 12 shows a partial schematic cross-sectional view of the aforementioned battery cell (the aforementioned production method of the battery cell), in which the layered part of the electrode assembly and the connection piece of the current collector stacked on the outer side of the layered part are sandwiched by the clip member, which are welded together by vibration welding through application of micro-vibration to the other of the pair of facing pieces of the clip member that is located on the inner side (winding center side) of the electrode assembly.
Figure 13:
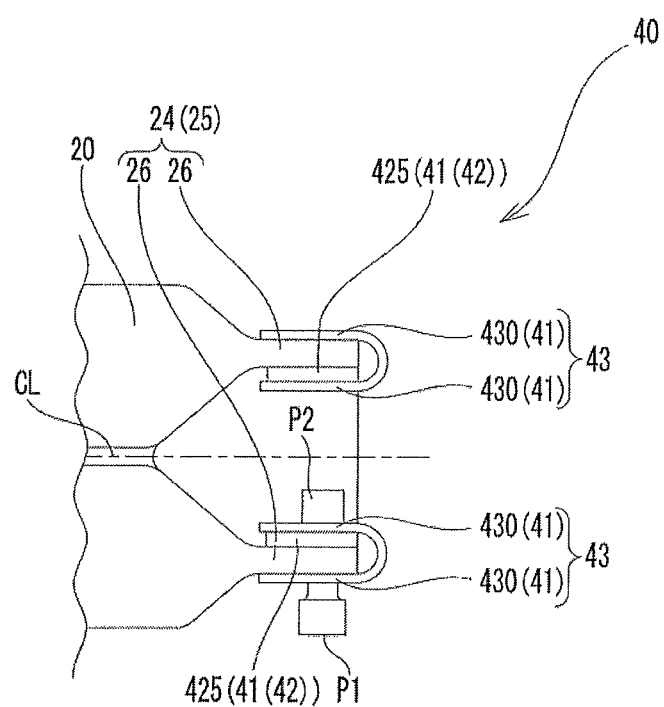
FIG. 13 shows a partial schematic cross-sectional view of a battery cell (a production method of the battery cell) according to still another embodiment of the present invention, in which a layered part of an electrode assembly and a connection piece of a current collector stacked on the inner side of the layered part are sandwiched by a clip member, which are welded together by vibration welding through application of micro-vibration to one of a pair of facing pieces of the clip member that is located on the outer side of the electrode assembly.
Figure 14:
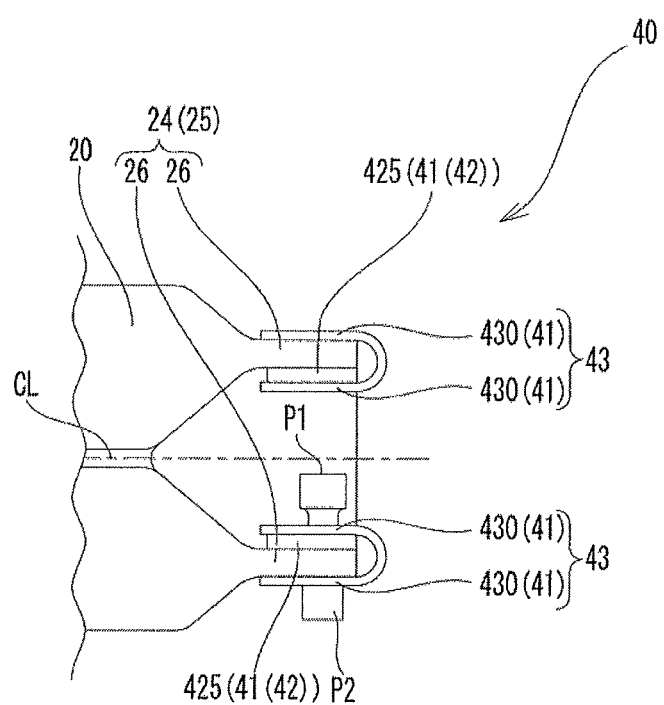
FIG. 14 shows a partial schematic cross-sectional view of the aforementioned battery cell (the aforementioned production method of the battery cell), in which the layered part of the electrode assembly and the connection piece of the current collector stacked on the inner side of the layered part are sandwiched by the clip member, which are welded together by vibration welding through application of micro-vibration to the other of the pair of facing pieces of the clip member that is located on the inner side (winding center side) of the electrode assembly.

Further, as shown in FIG. 9 and FIG. 10, on the premise that the main configuration of the current collector 42 is common with that of the aforementioned embodiment, the connection piece 425 of the current collector 42 is stacked with the other of the facing pieces 430 of the clip member 43 (the facing piece 430 on the outer side). Then, vibration may be applied to either one of the connection piece 425 located on the outer side and one of the facing pieces 430 (the connectors 41) located on the inner side that serves as the connector 41. That is, vibration may be applied while the horn P1 is pressed against either one of the connection piece 425 on the outer side and the facing piece 430 located on the inner side, and the anvil P2 is pressed against the other of the connection piece 425 on the outer side and the facing piece 430 located on the inner side.

In this case, vibration is applied to the connection piece 425 or one of the facing pieces 430 that serves as the connector 41. Therefore, the current collecting member 40 (the current collector 42 and the clip members 43) is formed by constituting the connector 41 (the connection piece 425 or one of the facing pieces 430) using a rolled material, and forming the material so that the rolling direction of the connector 41 corresponds to the amplitude direction of vibration in vibration welding. Thus, the connector 41 of the current collecting member 40 to be welded to the electrode plate 21 or 22 of the electrode assembly 20 stretches in a direction corresponding to the amplitude of vibration by application of vibration in vibration welding. In this way, when the connector 41 to which vibration is applied is constituted by a rolled material, and the rolling direction of the rolled member corresponds to the amplitude of vibration in vibration welding, the connector 41 stretches in the rolling direction (the amplitude direction of vibration) in welding. As a result, a reduction in vibration energy can be suppressed, and the same actions and effects as in the aforementioned embodiment can be exerted.

Further, as shown in FIG. 11 to FIG. 14, on the premise that the main configuration of the current collector 42 is common with that of the aforementioned embodiment, the connection piece 425 of the current collector 42 may be arranged so as to stack on the outer surface of or the inner surface of the layered part 26 of the electrode assembly 20, and the connection piece 425 and the projection 24 or 25 of the electrode assembly 20 may be sandwiched by the clip member 43. In this case, the pair of facing pieces 430 of the clip member 43 are located outermost. Therefore, with either one of the facing pieces 430 serving as the connector 41, vibration may be applied to the facing piece 430. That is, the horn P1 is pressed against either one of the facing pieces 430, and the anvil P2 is pressed against the other of the facing pieces 430, so that vibration is applied to the horn P1.

Figure 15:
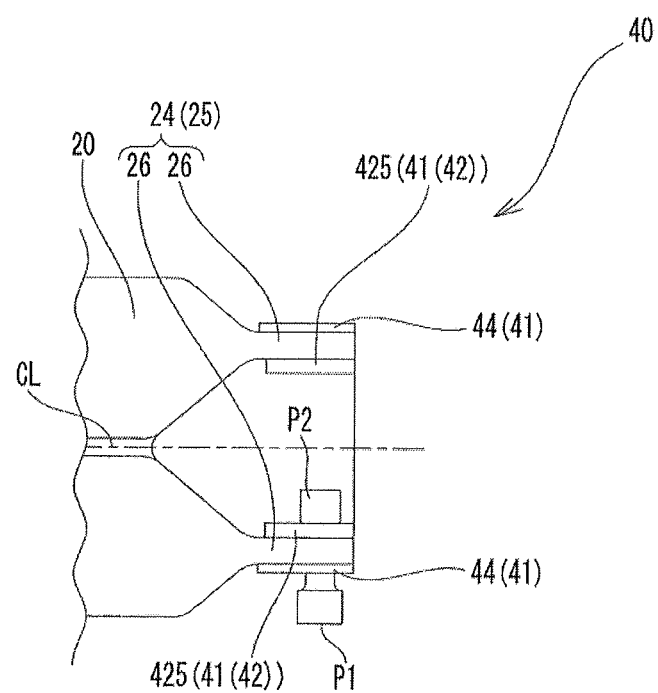
FIG. 15 shows a partial schematic cross-sectional view of a battery cell (a production method of the battery cell) according to still another embodiment of the present invention, in which a connection piece of a current collector is stacked on the inner side of a layered part of an electrode assembly, and a plate-shaped backing member is stacked on the outer side of the layered part, which are welded together by vibration welding through application of micro-vibration to the backing member.
Figure 16:
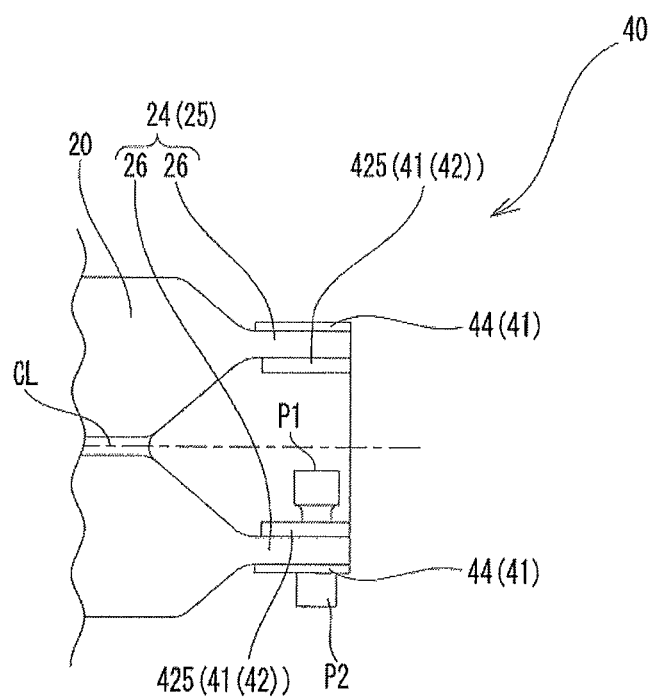
FIG. 16 shows a partial schematic cross-sectional view of the aforementioned battery cell (the aforementioned production method of the battery cell), in which the connection piece of the current collector is stacked on the inner side of the layered part of the electrode assembly, and the plate-shaped backing member is stacked on the outer side of the layered part, which are welded together by vibration welding through application of micro-vibration to the connection piece.
Figure 17:
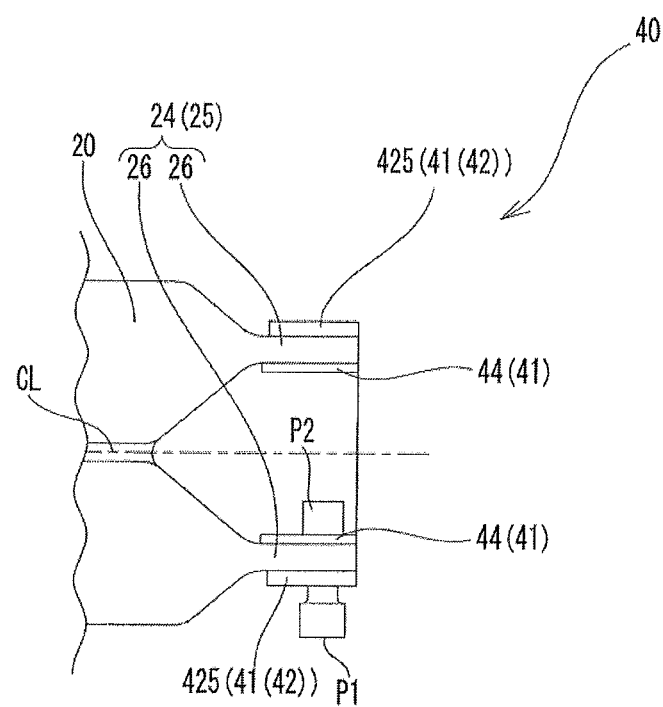
FIG. 17 shows a partial schematic cross-sectional view of a battery cell (a production method of the battery cell) according to still another embodiment of the present invention, in which a connection piece of a current collector is stacked on the outer side of a layered part of an electrode assembly, and a plate-shaped backing member is stacked on the inner side of the layered part, which are welded together by vibration welding through application of micro-vibration to the connection piece.
Figure 18:
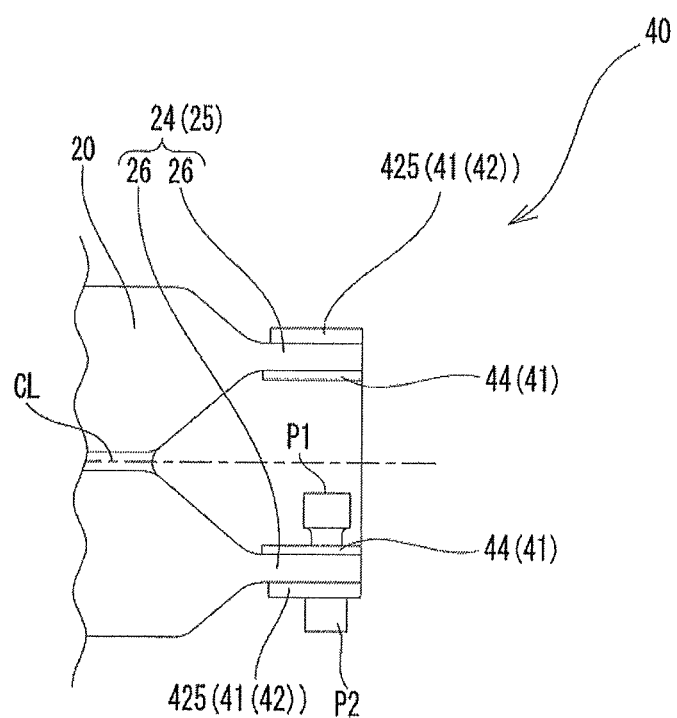
FIG. 18 shows a partial schematic cross-sectional view of the aforementioned battery cell (the aforementioned production method of the battery cell), in which the connection piece of the current collector is stacked on the outer side of the layered part of the electrode assembly, and the plate-shaped backing member is stacked on the inner side of the layered part, which are welded together by vibration welding through application of micro-vibration to the backing member.

In the aforementioned embodiment, the current collecting member 40 includes the current collector 42 and the clip members 43. However, there is no limitation to this. For example, as shown in FIG. 15 and FIG. 16, the current collecting member 40 may include the current collector 42 that is arranged along the electrode plate 21 or 22 of the electrode assembly 20 and that is electrically connected to the external terminal 30, and backing members 44 arranged along the electrode plate 21 or 22 of the electrode assembly 20.

In this case, the current collector 42 may be the same as in the aforementioned embodiment. Further, the current collector may have a common basic configuration with that of the current collector 42 of the aforementioned embodiment, and may be formed by stacking the connection piece 425 on the outer surface of the projection 24 or 25 (layered part 26) of the electrode assembly 20. Further, each of the backing members 44 may be arranged so as to sandwich the electrode plate 21 or 22 of the projection 24 or 25 with the connection piece 425 of the current collector 42. In this case, the backing member 44 needs only to be arranged along the projection 24 or 25 of the electrode assembly 20 (layered part 26). For example, the backing member 44 may be formed into a plate shape, or may be formed by pressing into a shape suitable for the embodiment of the projection 24 or 25 of the electrode assembly 20.

Further, when the current collecting member 40 is welded to the electrode assembly 20 by vibration welding, vibration is applied to the connection piece 425 or the backing member 44 that serves as the connector 41. Therefore, the connection piece 425 or the backing member 44 serving as the connector 41 is constituted by a rolled material, and the connection piece 425 or the backing member 44 is arranged so that the rolling direction corresponds to the amplitude direction of vibration in vibration welding. Accordingly, in the same manner as in the aforementioned embodiment, when the current collecting member 40 is welded to the electrode assembly 20 by ultrasonic vibration welding, the connection piece 425 or the backing member 44 with which the horn P1 is brought into contact and to which ultrasonic vibration is applied is constituted by a rolled material, and the material is formed so that the rolling direction corresponds to the amplitude direction of ultrasonic vibration in vibration welding.

In the aforementioned embodiment, the current collecting member 40 includes the current collector 42 and the clip members 43. However, there is no limitation to this. For example, the current collecting member 40 may be composed only of the current collector 42 connected to the external terminal 30. In this case, on the premise that vibration is applied to the connection piece 425 of the current collector 42 in vibration welding, the configuration may be such that the connection piece 425 serving as the connector 41 is constituted by a rolled material, and the current collector 42 (the current collecting member 40) is arranged (the material is formed) so that the rolling direction of the rolled material corresponds to the amplitude direction of vibration in vibration welding.

In the aforementioned embodiment, the connection pieces 425 of the current collector 42 are respectively bonded to the layered parts 26 on the premise that the projection 24 or 25 of the electrode assembly 20 has the two layered parts 26. However, there is no limitation to this. For example, the projection 24 or 25 of the electrode assembly 20 that is entirely bundled may be welded to the current collector 42 (the current collecting member 40) by vibration welding.

Further, the current collector 42 according to the aforementioned embodiment has a configuration in which the opening 424 is provided in the electrode attachment 421, and the pair of connection pieces 425 having both ends coupled respectively to both sides of the opening 424 are provided. However, there is no limitation to this. For example, the electrode attachment 421 of the current collector 42 may include the pair of connection pieces 425 bifurcated from the intermediate part 422 (in which only one ends of them are coupled to each other). Further, the current collector 42 (the electrode attachment 421) may form a single connection piece 425 by itself. That is, the current collector 42 (the electrode attachment 421) needs only to include the electrode attachment 421 that can be arranged to be stacked on the projection 24 or 25 of the electrode assembly 20.

In the aforementioned embodiment, the rolling direction of the connectors 41 completely coincides with the amplitude direction of vibration in vibration welding. However, there is no limitation to this. The rolling direction of the connectors 41 may correspond to the amplitude direction of vibration in vibration welding. That is, in vibration welding, not only the state where the rolling direction of the connectors 41 completely coincides with the amplitude direction of vibration in vibration welding is included. For example, the state where the rolling direction of the connectors 41 is inclined toward the amplitude direction of vibration within the range in which the stretching of the connectors 41 does not significantly attenuate the amplitude of vibration may be also included. Specifically, the current collecting member 40 (the connectors 41) may be formed so that the rolling direction of the connectors 41 is inclined from the amplitude direction of vibration in vibration welding, for example, within the range of 0° to 45°. In this case, it is more preferable that the current collecting member 40 (the connectors 41) be formed so that the rolling direction of the connectors 41 substantially coincides with the amplitude direction of vibration in vibration welding (for example, so that they are inclined from each other within the range of 0° to 10°).

Further, in the aforementioned embodiment, a rechargeable secondary battery cell (lithium ion secondary battery cell) has been described. However, the type and size (capacity) of the battery cell is arbitrarily selected. Further, a lithium ion secondary battery cell has been described in the aforementioned embodiment as an example of an electric storage device. However, there is no limitation to this. For example, the present invention can be applied also to electric storage devices of primary battery cells and capacitors such as an electric double layer capacitor, in addition to various secondary battery cells.

Example 1

Here, the following experiments were performed for evaluation of the bonding strength between the current collecting member and the electrode plate of the battery cell (electric storage device) according to the present invention.

Experimental Conditions 30 pieces of current collector foils (which correspond to the electrode plate in the aforementioned embodiment) with a thickness of 15 μm were stacked, and the stacked current collector foils were sandwiched by a clip member with a thickness of 0.1 mm. Thereafter, a current collector with a thickness of 1.5 mm was stacked on the clip member from the outer side. The thus stacked clip member and the current collector were sandwiched by an anvil arranged on the current collector side and a horn having a knurled pattern (specifically, a pattern in which a plurality of projections of a regular quadrangular pyramid shape are arrayed) arranged on the clip member side, which were subjected to ultrasonic welding. Here, all the current collector foils, the clip member, and the current collector were made of aluminum alloy.

Experimental Example 1

The rolling direction of the clip member and the vibration direction of ultrasound both were the vertical direction of FIG. 7.

Experimental Example 2

The rolling direction of the clip member was a direction orthogonal to the vertical direction (the horizontal direction) of FIG. 7, and the vibration direction of ultrasound was the vertical direction of FIG. 7.

Results

In Experimental example 1, the maximum power in ultrasonic welding was 760 W, and the tensile strength between the clip member and the current collector foils after the welding was 1259 N.

In Experimental example 2, the maximum power in ultrasonic welding was 640 W, and the tensile strength between the clip member and the current collector foils after the welding was 700 N.

As can be seen from the above, it was confirmed that the coincidence of the rolling direction of the rolled material constituting the clip member and the vibration direction of ultrasonic welding allowed efficient propagation of vibration energy and stronger bonding between the clip and the current collector foils.

REFERENCE SIGNS LIST

10: Case
11: Case Body
12: Cover Plate
13: Rivet
20: Electrode Assembly
21: Electrode Plate (Positive Electrode Plate)
22: Electrode Plate (Negative Electrode Plate)
23: Separator
24, 25: Projection
26: Layered Part
30: External Terminal
40: Current Collecting Member
41: Connector
42: Current Collector
43: Clip Member
44: Backing Member
420: Internal Connector
421: Electrode Attachment
422: Intermediate part
423: Through Hole
424: Opening
425: Connection Piece
430: Facing Piece
431: Coupling Part
P1: Horn
P2: Anvil
WA: Welding Area

The invention claimed is:

1. An electric storage device, comprising:
an external terminal;
an electrode assembly in which an electrode plate is layered and wound around a winding centerline such that a surface of the electrode plate is parallel to a rolling direction; and
a current collecting member that electrically connects the electrode assembly to the external terminal, the current collecting member including a connector welded to the electrode plate by vibration welding,
wherein at least the connector of the current collecting member comprises a rolled material that transfers an applied vibration different from an isotropic material,
wherein the rolled material is formed by rolling in a stretching direction, the rolled material transferring an applied vibration different from an isotropic material such that the stretching direction of the rolled material of the connector of the current collecting member corresponds to an amplitude direction of the applied vibration, and
wherein the connector extends on the surface of the electrode plate in the rolling direction.

2. The electric storage device according to claim 1, wherein the connector has a rolling direction corresponding to the amplitude direction of vibration to be applied in the vibration welding.

3. The electric storage device according to claim 1, wherein the vibration welding comprises ultrasonic vibration welding, in which the electrode plate and the connector are welded together by application of ultrasonic vibration to a horn sandwiching the electrode plate and the connector with an anvil, and
wherein the connector serves as a part facing the horn in the ultrasonic vibration welding.

4. The electric storage device according to claim 1, wherein the current collecting member comprises:
a current collector that is arranged along the electrode plate of the electrode assembly and is electrically connected to the external terminal; and
a clip member including a pair of facing pieces facing each other with the electrode plate interposed therebetween, the current collector being stacked on one of the pair of facing pieces, and
wherein the connector comprises a portion of the current collector that extends along the electrode plate or one of the pair of facing pieces.

5. The electric storage device according to claim 4, wherein only the facing pieces to which vibration is applied in the vibration welding include the rolled material.

6. The electric storage device according to claim 1, wherein the current collecting member comprises:
a current collector that is arranged along the electrode plate of the electrode assembly and is electrically connected to the external terminal; and
a backing member arranged along the electrode plate of the electrode assembly, and
wherein the connector comprises a portion of one of the current collector and the backing member that extends along the electrode plate.

7. The electric storage device according to claim 1, wherein only parts of the current collecting member to which vibration is applied in the vibration welding include the rolled material.

8. The electric storage device according to claim 1, wherein parts of the current collecting member to which vibration is not applied in the vibration welding include materials that are not rolled, and
wherein the isotropic material comprises one of a forged material formed by forging and a cut material formed by cutting.

9. The electric storage device according to claim 1, wherein the electrode assembly comprises a plurality of projections protruding from an end portion of the electrode plate in a longitudinal direction of an extension of the electrode assembly.

10. The electric storage device according to claim 9, wherein the electrode plate comprises a positive electrode plate, the projections including only the positive electrode plate.

11. The electric storage device according to claim 10, wherein the electrode assembly further comprises another plurality of projections protruding from another end portion of the electrode plate in the longitudinal direction of the extension of the electrode assembly.

12. The electric storage device according to claim 11, wherein the electrode plate further comprises a negative electrode plate, said another plurality of projections including only the negative electrode plate.

13. The electric storage device according to claim 9, wherein the current collecting member comprises:
   a current collector that is arranged along the electrode plate of the electrode assembly and is electrically connected to the external terminal; and
   clip members sandwiching the electrode plate and connecting the electrode assembly to the current collector.

14. The electric storage device according to claim 13, wherein the clip members have a U-shape in a cross section that extends around each of the projections.

15. The electric storage device according to claim 1, further comprising:
   a rivet conductively connecting the current collecting member to the external terminal.

16. The electric storage device according to claim 1, wherein the stretching direction of the rolled material of the connector of the current collecting member coincides with the amplitude direction of the applied vibration.

* * * * *